United States Patent
Nakamata

(10) Patent No.: US 10,685,903 B2
(45) Date of Patent: Jun. 16, 2020

(54) SEMICONDUCTOR DEVICE

(71) Applicant: Fuji Electric Co., Ltd., Kanagawa (JP)

(72) Inventor: Yuko Nakamata, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/296,078

(22) Filed: Mar. 7, 2019

(65) Prior Publication Data
US 2019/0326196 A1  Oct. 24, 2019

(30) Foreign Application Priority Data
Apr. 18, 2018 (JP) .................. 2018-079951

(51) Int. Cl.
*H01L 23/433* (2006.01)
*H01L 23/367* (2006.01)
*H01L 23/31* (2006.01)

(52) U.S. Cl.
CPC ........ *H01L 23/433* (2013.01); *H01L 23/3121* (2013.01); *H01L 23/367* (2013.01)

(58) Field of Classification Search
CPC . H01L 23/433; H01L 23/367; H01L 23/3121; H01L 23/3737; H01L 23/3736
See application file for complete search history.

(56) References Cited

U.S. PATENT DOCUMENTS

2017/0077009 A1  3/2017  Saito et al.

FOREIGN PATENT DOCUMENTS

| JP | 2017-59677 A | 3/2017 |
| WO | 2010/007804 A1 | 1/2010 |

*Primary Examiner* — Anthony Ho
(74) *Attorney, Agent, or Firm* — Chen Yoshimura LLP

(57) ABSTRACT

A semiconductor device, including: a semiconductor module including a layered substrate on which a semiconductor element is mounted, and a sealing material; and a cooler provided on the semiconductor module via a thermal compound. The thermal compound includes a base oil, microfillers having a ceramic as a main component, and nanofillers having a resin as a main component.

14 Claims, 2 Drawing Sheets

SEMICONDUCTOR DEVICE

BACKGROUND OF THE INVENTION

Technical Field

The present invention relates to a semiconductor device. In particular, the present invention relates to a highly-reliable semiconductor device that can suppress an increase in thermal resistance.

Background Art

Power semiconductor modules are widely used in fields where efficient power conversion is required. The domain of use of power semiconductor modules has expanded to the field of power electronics, such as industrial machinery, electric vehicles, and home electric appliances, for example. These power semiconductor modules have built-in switching elements and diodes, and Si (silicon) semiconductors or SiC (silicon carbide) semiconductors are used for these elements.

The power semiconductor module is used while being attached to a cooler, such as a heat dissipating fin, in order to allow heat generated from a chip made of a semiconductor element to escape. Ordinary heat dissipating fins have surface roughness, and gaps are formed when mounting the module on the fin, which causes the deterioration of contact thermal resistance. In order to reduce contact thermal resistance, a thermal compound formed mainly of a base oil and a ceramic filler is coated between the fin and the power semiconductor module.

A semiconductor device is known that includes, on a metal heat dissipating base, a layered substrate provided with a semiconductor chip, and a cooler is provided on the rear surface of the heat dissipating base via a thermal compound (e.g., see Patent Document 1).

RELATED ART DOCUMENT

Patent Document

Patent Document 1: Japanese Patent Application Laid-Open Publication No. 2017-59677

SUMMARY OF THE INVENTION

The thermal conductivity of a conventional thermal compound was approximately 1 W/m·K. This thermal conductivity value is lowest in the members positioned on the heat dissipating path from the semiconductor chip to the cooler, such as solder, a copper circuit, a ceramic insulating substrate, and a copper plate. One method of increasing the efficiency of an entire product that uses a power semiconductor module requires that the thermal conductivity of the thermal compound be increased.

In order to increase thermal conductivity, there have been attempts to increase the amount of the filler ordinarily included in the thermal compound, such as a ceramic. However, if the filler, such as a ceramic, is increased, then the relative proportion of base oil in the thermal compound will decrease and viscosity will increase, and there will be a reduction in workability during coating of the thermal compound between the power semiconductor module and the cooler. Furthermore, as a result of this, there is a risk that the void ratio in the product after coating could increase. There is demand for a highly-reliable semiconductor device that does not cause a reduction in workability or a rise in the void ratio, but rather achieves an increased thermal conductivity and a decreased thermal resistance of the thermal compound.

The inventor of the present invention, as the result of diligent research, found that further adding a nano-sized filler to a thermal compound formed mainly of a base oil and a ceramic filler can smooth the connection of the ceramic, increase the filling rate of a ceramic with high thermal conductance, and improve thermal conductivity while ensuring workability, thus leading to completion of the present invention.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor module including a layered substrate, a semiconductor element mounted on the layered substrate, and a sealing material that seals the semiconductor element and the layered substrate; and a cooler attached to the semiconductor module via a thermal compound, wherein the thermal compound includes a base oil, microfillers made of a ceramic as a main material with an average particle diameter of equal to or greater than 1 μm and less than 500 μm, and nanofillers made of a resin as a main material with an average particle diameter of equal to or greater than 0.1 nm and less than 500 nm.

In the aforementioned semiconductor device, the resin as the main material of the nanofillers may have a dynamic friction coefficient of 0.4 or less.

In the aforementioned semiconductor device, the nanofillers may be made of a fluororesin.

In the aforementioned semiconductor device, the average particle diameter of the nanofillers may be not less than 10 nm and not more than 100 nm.

In the aforementioned semiconductor device, a total volume of the nanofillers may be not less than 0.1% and not more than 10% with respect to a total volume of the microfillers.

In the aforementioned semiconductor devices, a ratio of the average particle diameter of the nanofillers relative to the average particle diameter of the microfillers may be not less than 0.0003 and not more than 0.01.

In the aforementioned semiconductor device, the average particle diameter of the microfillers may be not less than 1 μm and not more than 30 μm.

In the aforementioned semiconductor device, a total volume of the microfillers may be not less than 30% and not more than 75% with respect to a sum of the total volume of the microfillers and a total volume of the base oil.

In the aforementioned semiconductor device, the base oil may be electrically insulative and may have a heat resistance of about 150° C. or more.

In the aforementioned semiconductor device, the base oil may be a silicone based organic oil.

In the aforementioned semiconductor device, the base oil may be a non-silicone based organic oil.

In the aforementioned semiconductor device, the base oil may be electrically insulative silicone based or non-silicone based organic oil and may have a heat resistance of about 150° C. or more, the resin as the main material of the nanofillers may have a dynamic friction coefficient of 0.4 or less, the average particle diameter of the microfillers may be not less than 1 μm and not more than 30 μm, the average particle diameter of the nanofillers may be not less than 10 nm and not more than 100 nm, a ratio of the average particle diameter of the nanofillers relative to the average particle diameter of the microfillers may be not less than 0.0003 and not more than 0.01, a total volume of the nanofillers may be not less than 0.1% and not more than 10% with respect to a total volume of the microfillers, and the total volume of the microfillers may be not less than 30% and not more than 75% with respect to a sum of the total volume of the microfillers and a total volume of the base oil.

In another aspect, the present disclosure provides a thermal compound, including: a base oil; microfillers made of a ceramic as a main material with an average particle diameter of equal to or greater than 1 μm and less than 500 μm, and nanofillers made of a resin as a main material with an average particle diameter of equal to or greater than 0.1 nm and less than 500 nm.

In the aforementioned thermal compound, the base oil may be electrically insulative silicone based or non-silicone based organic oil and may have a heat resistance of about 150° C. or more, the resin as the main material of the nanofillers may have a dynamic friction coefficient of 0.4 or less, the average particle diameter of the microfillers may be not less than 1 μm and not more than 30 μm, the average particle diameter of the nanofillers may be not less than 10 nm and not more than 100 nm, a ratio of the average particle diameter of the nanofillers relative to the average particle diameter of the microfillers may be not less than 0.0003 and not more than 0.01, a total volume of the nanofillers may be not less than 0.1% and not more than 10% with respect to a total volume of the microfillers, and the total volume of the microfillers may be not less than 30% and not more than 75% with respect to a sum of the total volume of the microfillers and a total volume of the base oil.

The present invention makes it possible to provide a highly-efficient and highly-reliably semiconductor device that can improve thermal conductivity of a thermal compound and suppress an increase in thermal resistance.

It is to be understood that both the foregoing general description and the following detailed description are exemplary and explanatory, and are intended to provide further explanation of the invention as claimed.

DETAILED DESCRIPTION OF EMBODIMENT

An embodiment of the present invention will be described below with reference to the drawings. However, the present invention is not limited to the embodiment described below.

The present invention, in one embodiment, is a semiconductor device, including: a semiconductor module including a layered substrate on which a semiconductor element is mounted, and a sealing material; and a cooler provided on the semiconductor module via a thermal compound.

Figure 1:
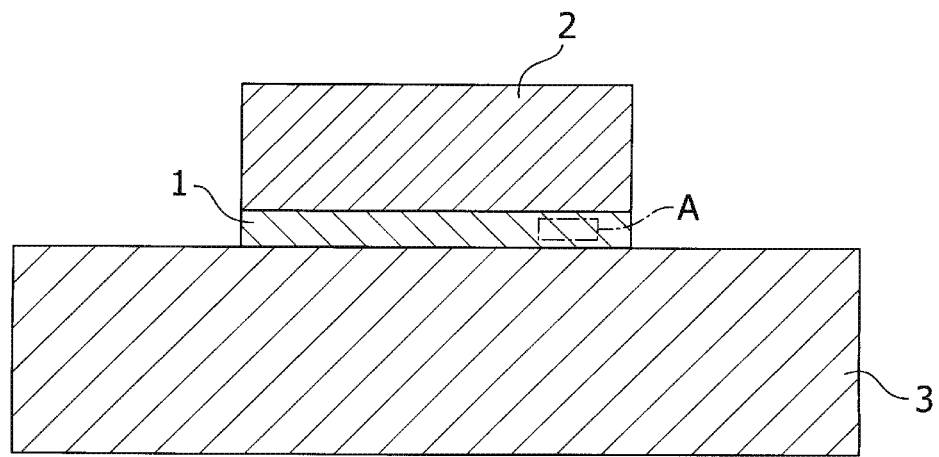
FIG. 1 is a conceptual cross-sectional view showing a cross-sectional structure of a semiconductor device according to the present invention.

FIG. 1 is a conceptual view showing one example of the semiconductor device according to one embodiment of the present invention. In FIG. 1, the semiconductor device has a cooler 3, a thermal compound 1, and a semiconductor module 2 layered in this order.

The semiconductor module 2 is a member obtained by sealing, with a sealing material, members to be sealed, which include at least the layered substrate on which the semiconductor element is mounted. The semiconductor module 2 can have various aspects, and there are no particular limitations for these aspects in the present invention.

An example of one aspect of the semiconductor module 2 includes a configuration having the structure described below. The semiconductor element may be mounted on the layered substrate via a bonding layer such as solder. An implant type printed substrate provided with an implant pin can be attached to the upper surface of the semiconductor element via a bonding layer such as solder, and these members may be sealed with the sealing material.

The semiconductor element is a power chip such as an IGBT or a diode chip, and various types of Si devices, SiC devices, GaN devices, or the like can be used. Furthermore, a combination of these devices may be used. It is possible to use a hybrid module or the like that uses an Si-IGBT and a SiC-SBD, for example. The number of mounted semiconductor elements may be one, or a plurality of semiconductor elements can be mounted.

The layered substrate can be formed of an insulating substrate, a first conductive plate formed on one surface of the insulating substrate, and a second conductive plate formed on the other surface. A material with excellent electrical insulation and thermal conductance can be used as the insulating substrate. Examples of the material of the insulating substrate include $Al_2O_3$, AlN, and SiN. For high withstand voltage applications, in particular, a material that has both electrical insulation and thermal conductivity is preferable, and it is possible to use AlN or SiN, but the material is not limited to these. A metal material with excellent processing characteristics, such as Cu or Al, can be used as the second conductive plate and the first conductive plate. Among these conductive plates, when made of copper, there are cases where the conductive plate not contacting the semiconductor element is referred to as the rear surface copper foil or the rear surface conductive plate. The conductive plates may be Cu or Al that has been subjected to a treatment such as Ni plating in order to prevent rust or the like. Examples of methods of providing the conductive plates on the insulating substrate include direct copper bonding and active metal brazing.

The bonding layer can be formed by using lead-free solder. For example, it is possible to use solder that is Sn—Ag—Cu based, Sn—Sb based, Sn—Sb—Ag based, Sn—Cu based, Sn—Sb—Ag—Cu based, Sn—Cu—Ni based, Sn—Ag based, or the like, but the solder is not limited to these.

As the printed substrate, a configuration can be used in which a conductive layer such as Cu or Al has been formed on a polyimide film substrate or an epoxy film substrate. A copper pin using copper can be used as the implant pin. The conductive layer of the printed substrate and the implant pin may also be Cu or Al that has been subjected to a treatment such as Ni plating in order to prevent rust or the like. This printed substrate and implant pin electrically connect the semiconductor elements to each other, or the semiconductor elements to the layered substrate. The implant pin, layered substrate, and semiconductor element can be bonded by using the solder bonding layer described above. Furthermore, drawing out the implant pin from the layered substrate to outside of the sealing material makes it possible to connect the implant pin to an external connection terminal.

In the present aspect, the members to be sealed, which include the semiconductor element, layered substrate, implant pin, and printed substrate, and may include other terminals or the like, are insulated and sealed with a sealing material. The sealing material includes a thermosetting resin and is preferably an epoxy resin, maleimide resin, cyanate resin, or a mixture of these, for example, and it is particularly preferable that the sealing material include an epoxy resin. The sealing material, in the most preferable aspect, can be made of an epoxy resin composition that includes an epoxy resin main agent and a curing agent, and may optionally include an inorganic filler or other additives. An aliphatic epoxy or alicyclic epoxy can be used as the epoxy resin main agent.

An aliphatic epoxy refers to an epoxy compound in which carbon that is directly bonded to an epoxy group forms an aliphatic hydrocarbon. Therefore, a compound that satisfies the above condition would be categorized as an aliphatic epoxy even if the compound includes an aromatic ring as the main skeleton. Examples of the aliphatic epoxy resin include a bisphenol A epoxy, a bisphenol F epoxy, a bisphenol AD epoxy, a biphenyl epoxy, a cresol novolac epoxy, a multi-functional epoxy with three or more functions, and the like, but the aliphatic epoxy resin is not limited to these. These can be used alone or with two or more types mixed together.

An alicyclic epoxy resin refers to an epoxy compound in which two carbon atoms forming an epoxy group form an alicyclic compound. Examples of the alicyclic epoxy resin include a monofunctional epoxy, a bifunctional epoxy, and a multifunctional epoxy with three or more functions, and the like, but the alicyclic epoxy resin is not limited to these. The alicyclic epoxy resin can also be used alone or mixed with two or more differing types of alicyclic epoxy resins.

The curing agent has no particular limitations as long as the curing agent can react with the epoxy resin main agent and cure, but it is preferable to use an acid anhydride-based curing agent. Examples of the acid anhydride-based curing agent include an aromatic acid anhydride, or specifically, phthalic anhydride, pyromellitic anhydride, trimellitic anhydride, and the like. The examples of the acid anhydride-based curing agent can also include a cyclic aliphatic acid anhydride, or specifically, tetrahydrophthalic anhydride, methyltetrahydrophthalic anhydride, hexahydrophthalic anhydride, methylhexahydrophthalic anhydride, methylnadic anhydride, and the like, or an aliphatic acid anhydride, or specifically, succinic anhydride, polyadipic acid anhydride, polysebacic anhydride, polyazelaic anhydride, and the like. The amount of the curing agent is preferably approximately not less than 50 parts by weight and not more than 170 parts by weight relative to 100 parts by weight of the epoxy resin main agent, and more preferably approximately not less than 80 parts by weight and not more than 150 parts by weight. If the amount of the curing agent is less than 50 parts by weight, there are cases where the glass transition temperature is reduced due to insufficient crosslinking, and if the amount of the curing agent is greater than 170 parts by weight, there are cases where moisture resistance, high heat deformation temperature, and heat resistance stability are reduced.

A curing accelerator can further be added to the epoxy resin composition as an optional component. For the curing accelerator, imidazole or a derivative thereof, a tertiary amine, borate ester, Lewis acid, organometallic compound, organic acid metal salt, or the like can be added as appropriate. The added amount of the curing accelerator is preferably not less than 0.01 parts by weight and not more than 50 parts by weight relative to 100 parts by weight of the epoxy resin main agent, and more preferably not less than 0.1 parts by weight and not more than 20 parts by weight.

Furthermore, examples of the inorganic filler that the epoxy resin composition may include as an optional component include fused silica, silica, alumina, aluminum hydroxide, titania, zirconia, aluminum nitride, talc, clay, mica, glass fiber, and the like, but the inorganic filler is not limited to these. These inorganic fillers can increase the thermal conductivity of the cured product and reduce the thermal expansion coefficient. These inorganic fillers may be used alone, or two or more types of these inorganic fillers may be mixed together. In addition, these inorganic fillers may be microfillers or may be nanofillers, and two or more inorganic fillers with differing particle diameters and types can be mixed together. In particular, it is preferable to use the inorganic filler having an average particle diameter of approximately not less than 0.2 μm and not more than 20 μm. When defining the total mass of the epoxy resin main agent and curing agent as 100 parts by weight, the added amount of the inorganic filler is preferably not less than 100 parts by weight and not more than 600 parts by weight, and more preferably not less than 200 parts by weight and not more than 400 parts by weight. If the amount of the inorganic filler is less than 100 parts by weight, there are cases where the thermal expansion coefficient of the sealing material increases and there is susceptibility to detachment and cracking. If the amount is greater than 600 parts by weight, there are cases where the viscosity of the composition increases and extrusion moldability worsens.

The epoxy resin composition may include optional additives within a range that does not harm the characteristics thereof. Examples of these additives include flame retardant, pigment for coloring the resin, and a plasticizer or silicon elastomer for improving cracking resistance, but the additives are not limited to these. These optional components and the added amounts thereof can be determined as appropriate by a person skilled in the art in accordance with the specifications required for the semiconductor device and/or sealing material.

The manufacturing of the semiconductor module of the aforementioned aspect can be performed by mounting the members to be sealed on a suitable mold, filling the sealing material into the mold, and then heat curing. Examples of this type of sealing body molding method include vacuum casting, transfer molding, and liquid transfer molding, but the molding method is not limited to a prescribed molding method. By using this type of molding method, it is possible to manufacture a semiconductor module in which, among the members to be sealed, one surface and the necessary external terminal of the first conductive plate (rear surface copper foil) are exposed, and the other members are insulated and sealed by the sealing material. Alternatively, when manufacturing the semiconductor module provided with a case, it can be performed by mounting the members to be sealed inside the case, filling the sealing material into the case, and then heat curing. In such case, the sealing material may be the thermosetting resin described above, or a silicone gel.

In the module according to the aforementioned aspect, the rear surface of the layered substrate, or in other words, the exposed main surface of the conductive plate on the side opposite to where the semiconductor element is mounted, is the rear surface of the semiconductor module, and can be the surface that contacts the thermal compound.

Alternatively, the semiconductor module may further include, on the rear surface of the layered substrate in the aforementioned aspect, a metal base substrate bonded via a solder bonding layer or the like. In this case, the exposed main surface of the metal base substrate is the rear surface of the semiconductor module, and can be the surface that contacts the thermal compound 1. The metal base substrate may be a flat plate material with excellent conductivity, such as copper or aluminum, and a protective film such as nickel or chromium may be formed on the surface. The rear surface conductive plate and the metal base substrate of the layered substrate are also referred to as the metal part of the semiconductor module.

As different aspects of the semiconductor module, a conductive connection member such as wire bonding or a lead frame may be used instead of the copper pin previously described, or the printed substrate need not be provided inside the sealing material, for example. In all cases, there are cases where the rear surface of the semiconductor module, which is the surface on which the thermal compound is coated, is the conductive plate (also called the copper plate, rear surface foil, etc.) forming a portion of the layered substrate, and cases where the rear surface of the semiconductor module is the metal heat dissipating base bonded to the layered substrate.

The thermal compound 1 is formed of a composition that includes a base oil and a filler. The thermal compound 1 functions as an adhesive layer between the semiconductor module 2 and the cooler 3, and as a heat dissipating layer for heat generated by the semiconductor module 2. The thermal conductivity of the thermal compound 1 is preferably approximately 10 W/(m·K) or higher. The thermal compound 1 is coated onto the rear surface of the semiconductor module 2 in a layered manner, the cooler 3 is superimposed thereon, and then pressed and fixed with a screw or the like, thus forming the semiconductor device. The thermal compound 1 is formed to contact at least the metal part of the rear surface of the semiconductor module, and preferably contacts the entire surface of the metal part. The thickness of the thermal compound layer after fixing is preferably thin in a range in which it is possible to mitigate warping of the semiconductor module 2 and cooler 3 positioned on both sides of the thermal compound layer, and the thickness may be approximately not less than 10 µm and not more than 100 µm, and more preferably is approximately not less than 20 µm and not more than 30 µm. The thermal compound is also required to be insulating. This is because the thermal compound being conductive would cause a short in the case of separation of the thermal compound. Furthermore, the power semiconductor module undergoes shape deformation such as warping caused by thermal stress, and thus, in order to be capable of accommodating such deformations, the thermal compound needs to have high viscosity like an organic oil and low elasticity, rather than being a highly-rigid material.

Next, the composition forming the thermal compound 1 will be described. An insulating non-silicone based or silicone based organic oil can be used as the base oil. Examples of the non-silicone based organic oil include compositions including, as a main component, mineral oil, hydrocarbon oil such as synthetic hydrocarbon oil, ester oil, ether oil, fluorine oil, and the like, but the non-silicone based organic oil is not limited to these. An example of the silicone-based organic oil includes a composition having organopolysiloxane as a main component, and preferably a composition having organopolysiloxane with at least two aliphatic unsaturated hydrocarbon groups in one molecule, but the silicone-based organic oil is not limited to these. The base oil of the present embodiment is not limited to having a specific composition as long as the base oil can used as the base oil of a thermal compound for an ordinary semiconductor device and has insulating characteristics and a heat resistance of approximately 150° C.

The filler included in the composition forming the thermal compound 1 is preferably an insulating material, and includes microfillers having a ceramic as a main component, and nanofillers having a resin as a main component. In the present specification, microfiller refers to a material with an average particle diameter of approximately 1 µm or more to less than 500 µm. Furthermore, nanofiller refers to a material with an average particle diameter of approximately 0.1 nm or more to less than 500 nm. Both average particle diameters are based on particle diameters measured by using a laser diffraction method.

The ceramic microfillers may be a material that has been ordinarily used as a filler in conventional technology. Therefore, the microfillers may be fillers made of a ceramic material with a thermal conductivity of approximately 25 W/m·K or higher, examples of which include alumina ($Al_2O_3$), boron nitride (BN), aluminum nitride (AlN), silicon nitride ($Si_3N_4$), silicon oxide ($SiO_2$), silicon carbide (SiC), magnesium oxide (MgO), or a mixture of these, but the microfillers are not limited to these. A microfiller of a ceramic material that does not reach the preferable thermal conductivity by itself can be mixed with a ceramic material having a higher thermal conductivity.

The average particle diameter of the microfillers is preferably approximately not less than 1 µm and not more than 30 µm, and more preferably approximately not less than 20 µm and not more than 30 µm. When the average particle diameter of the microfillers is in this range, thermal conductivity and viscosity are particularly good. If the average particle diameter of the microfillers is too large, there are cases where gaps occur between the microfillers and thermal conductivity is reduced. If the average particle diameter of the microfillers is too small, there are cases where the base oil or the like interposed between the microfiller particles becomes too great in quantity, and thus thermal conductance worsens and viscosity also increases. In addition to the aforementioned, it is necessary to select the microfillers such that the maximum particle diameter of the microfillers is less than the thickness of the thermal compound layer (the thickness after assembling and fixing the semiconductor device). The preferable particle diameter of the microfillers is also related to the particle diameter of the nanofillers, and if the aforementioned range is used, it is easy for the nanofillers to be interposed between the gaps or the like between the microfillers. The shape of the microfillers is preferably a shape that is less likely to cause a rise in viscosity, such as a spherical or oval shape or the like.

The blending ratio of the microfillers in the thermal compound is preferably approximately not less than 30 volume % and not more than 75 volume %. In the present invention, the blending ratio (volume %) of the microfillers is a value obtained by [total volume of microfillers/(total volume of microfillers+volume of base oil)]*100(%). The denominator in the formula of total volume of microfillers+volume of base oil is approximately equal to the volume of the thermal compound layer. A higher amount of the microfillers improves thermal conductance, but if too high, there are cases where fluidity is reduced and viscosity increases even if the nanofillers are added. The viscosity of the thermal compound is preferably 100 Pa·s or lower, and the blending ratio of the microfillers in order to achieve such viscosity is preferably a range of approximately not less than 50 volume % and not more than 75 volume %. Here, viscosity refers to a value obtained by measurement with a B type rotational viscometer. If viscosity is high, there are cases where workability worsens and it becomes impossible to form the thermal compound layer with a uniform thickness. If there is a change of 20% or more from the target thickness for the thermal compound layer, voids are susceptible to occurring at the interface of the metal part and cooler. Furthermore, a high viscosity leads to the generation of voids inside the thermal compound layer, and thus is not preferable.

The resin nanofillers can be a material with a dynamic friction coefficient lower than that of the aforementioned microfillers, and are preferably a material that does not melt or deform under the operating temperature conditions of the semiconductor device but rather continues to exist as particles. Specifically, the resin nanofillers can be a material with a dynamic friction coefficient of 0.4 or less and that does not soften, melt, or react in a range of −40° C. to +150° C. but rather continues to exist as individual particles. This type of nanofiller makes it possible to improve sliding between the microfillers by being interposed in the area around the microfillers or entering into gaps between the microfillers, which makes it possible to fill a large number of microfillers into the base oil.

Specifically, the nanofiller is preferably a nanofiller having a fluororesin as a main component, for example. A nanofiller having a fluororesin as a main component is less likely to aggregate and is not easily adsorbed with the microfiller, and thus is particularly preferable from the viewpoint of filling a large number of microfillers into the base oil. A fluororesin refers to a polymer compound obtained by polymerizing an olefin monomer including fluorine, and includes a C—F bond. Examples of preferable fluororesins include polytetrafluoroethylene (PTFE), a tetrafluoroethylene/hexafluoropropylene copolymer (FEP), a tetrafluoroethylene/ethylene copolymer (ETFE), polyvinylidene fluoride (PVDF), a tetrafluoroethylene/perfluoroalkyl vinyl ether copolymer (PFA), polychlorotrifluoroethylene (PCTFE), or a combination of two or more types of these, but the fluororesin is not limited to these. Examples of preferable nanofillers other than a fluororesin include polybenzimidazole (PBI), nylon, polyetheretherketone (PEEK), polyphenylene sulfide (PPS), polystyrene, polyvinyl chloride, polypropylene, or a combination of two or more types of these, but the nanofiller is not limited to these. It should be noted that even when a ceramic such as alumina was introduced as the nanofillers, viscosity did not improve. This is thought to be because of the large dynamic friction coefficient.

The average particle diameter of the nanofillers is preferably approximately not less than 10 nm and not more than 100 nm, and more preferably approximately not less than 10 nm and not more than 50 nm. If the average particle diameter is smaller than 10 nm, dispersion becomes difficult, and if larger than 100 nm, there is a tendency for viscosity to rise. Furthermore, as shown in Table 2, the average particle diameter of the nanofillers can be determined in relationship with the average particle diameter of the microfillers, and it is preferable that the average particle diameter of the nanofillers/the average particle diameter of the microfillers be approximately not less than 0.0003 and not more than 0.001. In this range, the nanofillers can be efficiently interposed between the microfiller particles, and fluidity of the thermal compound can be improved, which makes it possible to suppress viscosity as a result.

The blending ratio of the nanofillers in the thermal compound is preferably approximately not less than 0.1 volume % and not more than 10 volume %. In the present invention, the blending ratio (volume %) of the nanofillers is a value obtained by (total volume of nanofillers/total volume of microfillers)*100. With the blending ratio in this range, it is possible to suppress a rise in viscosity and to set the thermal conductivity to a preferable value. If the blending ratio of the nanofillers is too high, there are cases where the thermal conductivity is reduced.

The composition forming the thermal compound 1 may include optional additives in addition to the base oil, microfillers, and nanofillers, in a range that does not harm the characteristics of the composition. Examples of the additives include an antioxidant and a modifier, but are not limited to these. The thermal compound 1 is preferably insulating, and preferably does not include conductive materials such as metal particles. This is because there is a risk that the wiring or the like of the semiconductor device will short in a case where the thermal compound 1 scatters. The composition used as the thermal compound 1 can be obtained by mixing the microfillers and the nanofillers, and then mixing these with the base oil.

Figure 2:
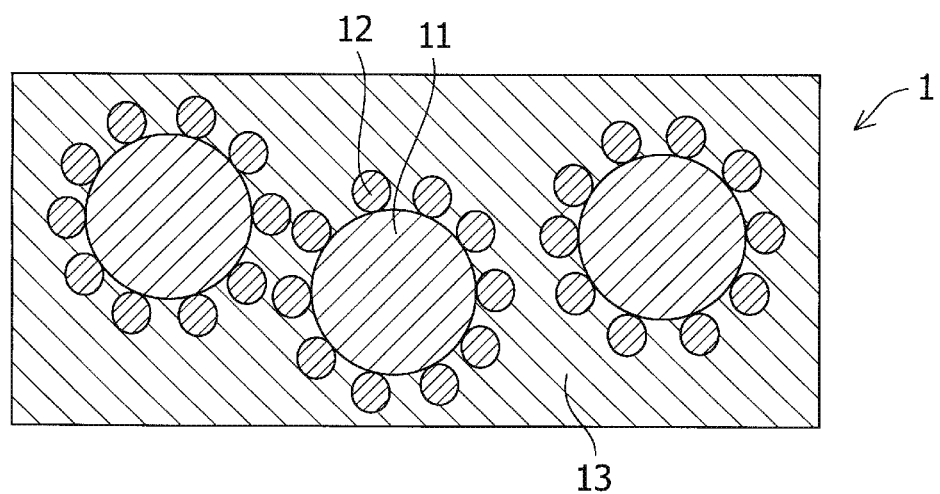
FIG. 2 is a conceptual cross-sectional view in which the portion shown by A in FIG. 1 has been enlarged.

FIG. 2 is a conceptual cross-sectional view in which the portion shown by A in the thermal compound layer 1 in FIG. 1 has been enlarged. In the thermal compound layer 1, a base oil 13 contains microfillers 11 and nanofillers 12, which are dispersed in the base oil. The nanofillers 12 exist between the plurality of microfillers 11 and function as a lubricant between the plurality of microfillers 11. FIG. 2 is a conceptual view for describing the present invention, and the relative relationship between the diameter of the microfillers 11 and the nanofillers 12, the number of nanofillers 12 present around the microfillers 11, the distance between the microfillers, etc., do not limit the present invention. Furthermore, there are also cases where the nanofillers 11 are present in the base oil 13 as isolated or aggregated.

The cooler 3 may be any ordinarily-used cooler, and may be an air-cooled type, or a water-cooled type, or a fin, or plate-shaped. In addition, the material of the cooler may be a member with excellent heat conduction performance and conductivity; a metal member such as Cu or Al is used, for example, and if lightweight characteristics are required, then Al is preferable. The Al member cooler 3 can be subjected to a plating treatment or the like with Ni, Cr, etc. as necessary, in order for at least the locations contacting the thermal compound to have conductivity. The shape and specification of the cooler 3 can be selected as desired so as to fit the purpose of use or the like of the semiconductor module and is not limited to a specific configuration.

The semiconductor device according to the present embodiment improves the thermal conductivity of the thermal compound present in the heat dissipating path from the semiconductor element, and improves heat dissipating characteristics as a whole. This makes it possible to provide a highly-reliable semiconductor device that suppresses breakdown of the semiconductor element caused by a rise in thermal resistance.

Working Examples

Working examples of the present invention will be used below to describe the present invention in further detail. However, the present invention is not limited to the scope of the working examples below.

<1. Blending Ratio of Microfillers and Viscosity>

Examination was performed for the relationship between blending ratio and viscosity, and the effect of adding nanofillers, for thermal compounds in which the blending ratio of microfillers is varied.

The thermal compounds of this working example was prepared by using nanofillers (PTFE particles, dynamic friction coefficient=0.1, average particle diameter 50 nm, blending ratio 5 volume %), microfillers ($Al_2O_3$ particles, average particle diameter 30 μm), and a silicone-based base oil (main component: dimethylsilicone oil). The nanofillers and microfillers were mixed first, and this mixture was added to the base oil and uniformly scattered to obtain the thermal compound. The blending ratio of the microfillers was varied between 20 volume % to 75 volume %. The viscosity of the obtained thermal compound was measured by using a B type viscometer (rotational viscometer: HBDV-1M, manufactured by Brookfield).

Thermal compounds of comparative examples were prepared in the same manner as above, except that nanofillers were not added; viscosity was measured using the same method as above.

Figure 3:
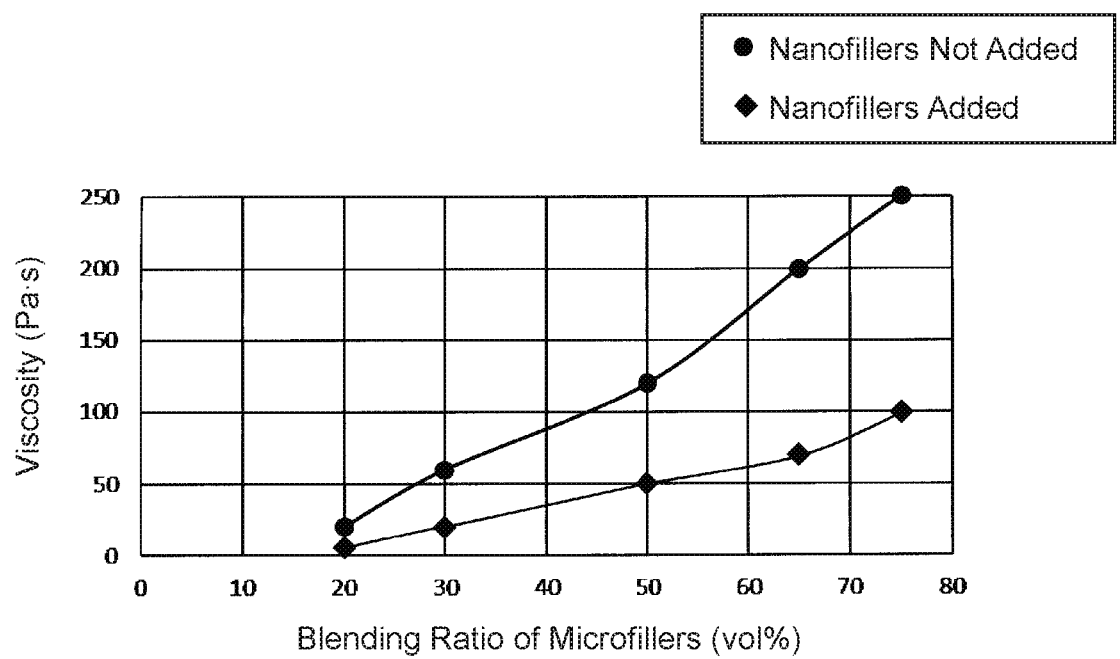
FIG. 3 is a graph showing the relationship (the effect of adding nanofillers) between the microfiller blending ratio and the viscosity of the thermal compound according to an embodiment of the present invention.

These results are shown in FIG. 3. From the graph in FIG. 3, when comparing the thermal compounds of the working examples (nanofillers added) with the thermal compounds of the comparative examples (nanofillers not added), which have identical blending ratios of the microfillers, it is understood that the adding of the nanofillers suppresses the value of the viscosity to less than half, and in particular, to approximately 30%-40%, as compared to not adding the nanofillers. In particular, the viscosity of the thermal compound is preferably 100 Pa·s or lower, and the blending ratio of the microfillers in order to achieve this type of viscosity is preferably a range of approximately not less than 50 volume % and not more than 75 volume %.

<2. Microfiller Diameter and Viscosity>

Examination was performed for the relationship between the average particle diameter of the microfillers and viscosity, and the effect of adding nanofillers, for thermal compounds in which the average particle diameter of the microfillers is varied.

The thermal compounds of these working examples were prepared by using nanofillers (PTFE particles, dynamic friction coefficient=0.1, average particle diameter 50 nm, blending ratio 5 volume %), microfillers ($Al_2O_3$ particles, average particle diameter of 0.5 to 30 μm, blending ratio 50 volume %), and a silicone-based base oil (main component: dimethylsilicone oil) in the same manner as section 1 above. The average particle diameter of the microfillers was varied from 0.5 μm to 30 μm. The viscosity of the obtained thermal compound was measured in the same manner as section 1 described above.

Thermal compounds of comparative examples were prepared in the same manner as above, except that nanofillers were not added; viscosity was measured using the same method as above.

Figure 4:
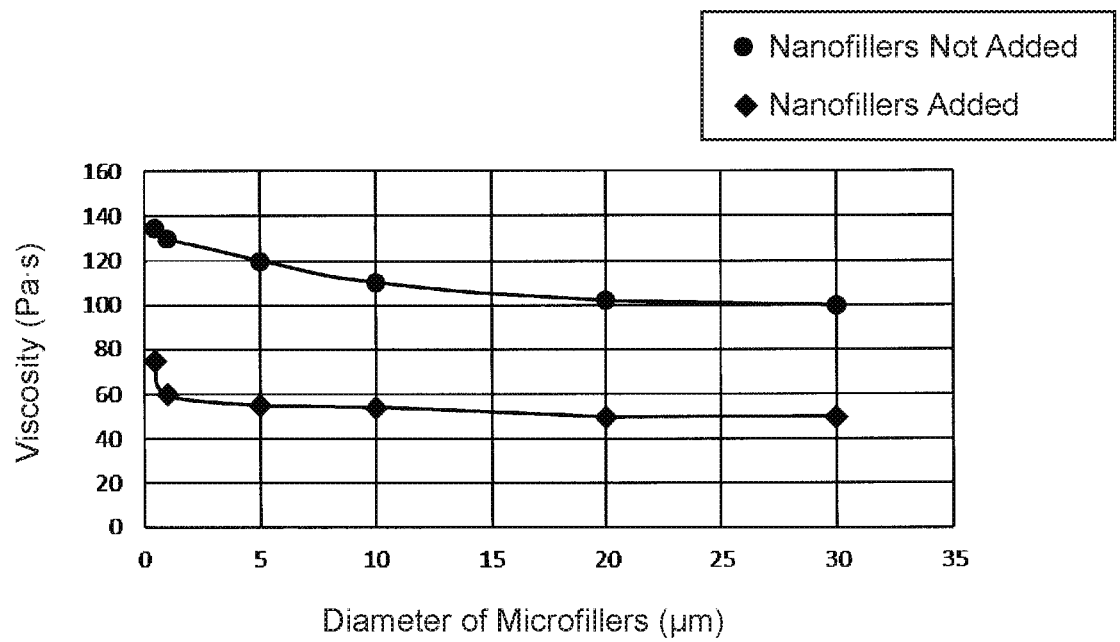
FIG. 4 is a graph showing the relationship (the effect of adding nanofillers) between the average particle diameter of the microfillers and the viscosity of the thermal compound according to the embodiment of the present invention.

These results are shown in FIG. 4. From the graph in FIG. 4, when comparing the thermal compounds of the working examples (nanofillers added) with the thermal compounds of the comparative examples (nanofillers not added), which have identical average particle diameters of the microfillers, it is understood that the adding of the nanofillers suppresses the value of the viscosity to approximately half, as compared to not adding the nanofillers. Furthermore, it is understood that workability is suitable in a range where the average particle diameter of the microfillers is approximately 1 μm or more.

<3. Characteristic Evaluation>

The thermal compound was prepared, and the characteristics thereof were evaluated. The nanofillers (PTFE particles, dynamic friction coefficient=0.1) and microfillers ($Al_2O_3$ particles) were mixed first, and this mixture was added to a silicone-based base oil (main component: dimethylsilicone oil) and uniformly scattered to obtain the thermal compounds. The specifications and blending ratios of the nanofillers and microfillers of the evaluated thermal compounds are shown in the table below. Filler diameter in the table below refers to the average particle diameter.

TABLE 1

| | Microfiller Diameter μm | Microfiller Blending Ratio vol % | Nanofiller Diameter nm | Nanofiller Blending Ratio vol % | Nanofiller Diameter/ Microfiller Diameter |
|---|---|---|---|---|---|
| Test Example 1 | 10 | 50 | 10 | 5 | 0.001 |
| Test Example 2 | 10 | 50 | 50 | 5 | 0.005 |
| Test Example 3 | 10 | 50 | 100 | 5 | 0.01 |
| Test Example 4 | 30 | 50 | 10 | 5 | 0.000333333 |
| Test Example 5 | 30 | 50 | 50 | 5 | 0.001666667 |
| Test Example 6 | 30 | 50 | 100 | 5 | 0.003333333 |
| Test Example 7 | 10 | 50 | 50 | 0.1 | 0.005 |
| Test Example 8 | 10 | 50 | 50 | 1 | 0.005 |
| Test Example 9 | 10 | 50 | 50 | 10 | 0.005 |
| Comparative Example 1 | 10 | 50 | — | — | — |
| Comparative Example 2 | 10 | 25 | — | — | — |

The characteristics of the obtained thermal compounds were evaluated by using test pieces. The thermal conductivity was measured by using a thermal conductivity measuring device TCi manufactured by Rigaku Corporation. The viscosity was measured in the same manner as sections 1 and 2 described above. The reference for judgment of workability was, when the thermal compound was coated at a thickness of 100 μm, "Good" for cases where the unevenness in thickness was equal to or less than 20%, and "Not Good" for cases greater than 20%. The thickness was measured by an optical thickness meter (displacement meter) and cross-sectional photographs. The void ratio was evaluated based on the area ratio of voids by interposing a 100 μm spacer between slide glass and an aluminum plate, filling in 0.1 g of the thermal compound, and then observing the generation of voids before and after a heat cycle test. The void ratio before the heat cycle test was 1 or less. The heat cycle test condition was 1000 cycles, with 1 cycle being −40° C. for 30 minutes and 175° C. for 30 minutes. The area ratio was calculated by (void area/total sum of void area and compound area)*100) for a case where the glass plate was observed in a plan view from the direction vertical to the surface of the glass plate. The results are shown in Table 2. The void ratio shows the void ratio after the heat cycle test in Table 2. By performing the heat cycle test, voids are markedly susceptible to occurring, and there is also correspondence with the thermal history when the compound is actually used in the semiconductor module, and thus the heat cycle test is effective in judging the characteristics of the thermal compounds. In the thermal compounds according to the present invention, a substantial increase in the void ratio was not observed.

TABLE 2

|  | Conductivity W/mK | Viscosity Pa · s | Workability | Void Ratio |
|---|---|---|---|---|
| Test Example 1 | 12 | 53 | Good | 1 or less |
| Test Example 2 | 12 | 54 | Good | 1 or less |
| Test Example 3 | 12 | 60 | Good | 1 or less |
| Test Example 4 | 13 | 48 | Good | 1 or less |
| Test Example 5 | 13 | 50 | Good | 1 or less |
| Test Example 6 | 13 | 62 | Good | 1 or less |
| Test Example 7 | 12 | 54 | Good | 1 or less |
| Test Example 8 | 12 | 54 | Good | 1 or less |
| Test Example 9 | 10 | 50 | Good | 1 or less |
| Comparative Example 1 | 11 | 200 | Not Good | 10 |
| Comparative Example 2 | 3 | 50 | Good | 15 |

From the results shown above, it is understood that having the nanofillers and microfillers coexist in the thermal compound reduces the viscosity of the thermal compound, and can also decrease the generation of voids after the heat cycle test. As a result, it is understood that the filling amount of the microfillers can be increased.

<4. Manufacturing of Semiconductor Device and Characteristic Evaluation>

A power semiconductor module was fabricated. A Denka SIN plate (manufactured by Denka Kagaku Kogyo; frame length 1.0 mm) with a Cu conductive plate thickness of 0.3 mm and an insulating substrate thickness of 0.625 mm was used as the layered substrate. The members to be sealed were manufactured by arranging and solder-bonding, in an $N_2$ reflow furnace, solder and a Si power semiconductor element, solder and a copper pin, and a printed substrate on the layered substrate. Next, the sealing material was disposed such that the rear surface conductive plate was exposed. The members to be sealed were set in a mold and then sealed with the sealing material. For the sealing material, an aliphatic epoxy resin main agent: jER630 (manufactured by Mitsubishi Chemical Corporation), a curing agent: jER CURE 113 (manufactured by Mitsubishi Chemical Corporation), and an inorganic filler (silica): Excelica with an average particle diameter of several µm to several dozen µm (TOKUYAMA), were mixed at a mass ratio of 10:5:3. This sealing material was vacuum defoamed and injected into the mold. This was subjected to primary curing at 100° C. for 1 hour, and then secondary curing at 150° C. for 3 hours, thereby obtaining the power semiconductor module.

<Evaluation>

A heat cycle test was performed on the power semiconductor device described above. In the heat cycle test, one cycle was room temperature for 30 minutes, −40° C. for 1 hour, room temperature for 30 minutes, and 175° C. for 1 hour, and this was repeated for 2000 cycles. The electrical characteristics of the Si power semiconductor element were confirmed after the end of the 2000 cycles. The result was that there was no change in characteristics. Furthermore, the void ratio after the end of the 2000 cycles was 1 or less when measured with an ultrasonic flaw detection device (SAT).

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor module including a layered substrate, a semiconductor element mounted on the layered substrate, and a sealing material that seals the semiconductor element and the layered substrate; and
   a cooler attached to the semiconductor module via a thermal compound,
   wherein the thermal compound includes a base oil, microfillers made of a ceramic as a main material with an average particle diameter of equal to or greater than 1 µm and less than 500 µm, and nanofillers made of a resin as a main material with an average particle diameter of equal to or greater than 0.1 nm and less than 500 nm.

2. The semiconductor device according to claim 1, wherein the resin as the main material of the nanofillers has a dynamic friction coefficient of 0.4 or less.

3. The semiconductor device according to claim 2, wherein the nanofillers are made of a fluororesin.

4. The semiconductor device according to claim 1, wherein the average particle diameter of the nanofillers is not less than 10 nm and not more than 100 nm.

5. The semiconductor device according to claim 1, wherein a total volume of the nanofillers is not less than 0.1% and not more than 10% with respect to a total volume of the microfillers.

6. The semiconductor device according to claim 1, wherein a ratio of the average particle diameter of the nanofillers relative to the average particle diameter of the microfillers is not less than 0.0003 and not more than 0.01.

7. The semiconductor device according to claim 1, wherein the average particle diameter of the microfillers is not less than 1 µm and not more than 30 µm.

8. The semiconductor device according to claim 1, wherein a total volume of the microfillers is not less than 30% and not more than 75% with respect to a sum of the total volume of the microfillers and a total volume of the base oil.

9. The semiconductor device according to claim 1, wherein the base oil is electrically insulative and has a heat resistance of about 150° C. or more.

10. The semiconductor device according to claim 9, wherein the base oil is a silicone based organic oil.

11. The semiconductor device according to claim 10, wherein the base oil is a non-silicone based organic oil.

12. The semiconductor device according to claim 1,
   wherein the base oil is electrically insulative silicone based or non-silicone based organic oil and has a heat resistance of about 150° C. or more,
   wherein the resin as the main material of the nanofillers has a dynamic friction coefficient of 0.4 or less, wherein the average particle diameter of the microfillers is not less than 1 μm and not more than 30 μm, wherein the average particle diameter of the nanofillers is not less than 10 nm and not more than 100 nm, wherein a ratio of the average particle diameter of the nanofillers relative to the average particle diameter of the microfillers is not less than 0.0003 and not more than 0.01, wherein a total volume of the nanofillers is not less than 0.1% and not more than 10% with respect to a total volume of the microfillers, and wherein the total volume of the microfillers is not less than 30% and not more than 75% with respect to a sum of the total volume of the microfillers and a total volume of the base oil.

13. A thermal compound, comprising: a base oil; microfillers made of a ceramic as a main material with an average particle diameter of equal to or greater than 1 μm and less than 500 μm, and nanofillers made of a resin as a main material with an average particle diameter of equal to or greater than 0.1 nm and less than 500 nm.

14. The thermal compound according to claim 13, wherein the base oil is electrically insulative silicone based or non-silicone based organic oil and has a heat resistance of about 150° C. or more, wherein the resin as the main material of the nanofillers has a dynamic friction coefficient of 0.4 or less, wherein the average particle diameter of the microfillers is not less than 1 μm and not more than 30 μm, wherein the average particle diameter of the nanofillers is not less than 10 nm and not more than 100 nm, wherein a ratio of the average particle diameter of the nanofillers relative to the average particle diameter of the microfillers is not less than 0.0003 and not more than 0.01, wherein a total volume of the nanofillers is not less than 0.1% and not more than 10% with respect to a total volume of the microfillers, and wherein the total volume of the microfillers is not less than 30% and not more than 75% with respect to a sum of the total volume of the microfillers and a total volume of the base oil.

* * * * *